(12) United States Patent
Mohindra

(10) Patent No.: US 6,317,067 B1
(45) Date of Patent: *Nov. 13, 2001

(54) PULSE DENSITY MODULATION BASED DIGITAL-TO-ANALOG CONVERSION

(75) Inventor: Rishi Mohindra, Milpitas, CA (US)

(73) Assignee: Philips Electronics North America Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/205,975

(22) Filed: Dec. 4, 1998

(51) Int. Cl.$^7$ ............... H03M 1/66; H03M 3/00

(52) U.S. Cl. ............... 341/145; 341/143

(58) Field of Search ............... 341/145, 141, 341/144, 143; 377/33; 455/323; 327/172, 306; 375/232, 319; 371/2

(56) References Cited

U.S. PATENT DOCUMENTS

| | | | |
|---|---|---|---|
| 5,337,338 | * | 8/1994 | Sutton et al. ............... 377/33 |
| 5,764,172 | | 6/1998 | Rodal . |
| 5,784,019 | * | 7/1998 | Wong et al. ............... 341/141 |
| 6,081,150 | * | 6/2000 | Yamaura et al. ............... 327/306 |
| 6,167,080 | * | 12/2000 | Hee et al. ............... 375/232 |
| 6,173,019 | * | 1/2001 | Hee et al. ............... 375/319 |

* cited by examiner

Primary Examiner—Patrick Wamsley

(57) ABSTRACT

An approach for converting an M-bit digital input value into an analog output signal involves separately processing the (M–N) number of most significant bits and the N number of least significant bits of the M-bit digital input value. The N number of least significant bits are converted by a pulse density modulator into a pulse density modulated signal. The pulse density modulated signal is processed by a filter to provide a first analog signal. The (M–N) number of most significant bits are processed by a static digital-to-analog converter to provide a second analog signal. The first and second analog signals are combined to provide the analog output signal.

11 Claims, 2 Drawing Sheets

PULSE DENSITY MODULATION BASED DIGITAL-TO-ANALOG CONVERSION

FIELD OF THE INVENTION

The invention relates to signal processing, and more specifically, to converting digital signals into analog signals.

BACKGROUND OF THE INVENTION

In electronic circuits, digital signals are commonly converted to analog signals using digital-to-analog converters. Conventional digital-to-analog converters, sometimes referred to as "static" digital-to-analog converters, receive and process digital input data using discrete hardware components to generate an analog signal that represents the digital input data. The voltage level of the analog signal varies according to the digital input signal. For example, a two (2) bit static digital-to-analog converter with a voltage range of zero (0) to five (5) volts, provides an analog output of zero (0) to five (5) volts in increments of 1.25 volts, based upon the value of the two (2) bit input word. As the number of bits in the digital input word is increased, the size of the analog increments decrease. One of the problems with static digital-to-analog converters is that the discrete hardware components require a relatively large amount of space and consume a relatively large amount of power, making them unsuitable for applications that require compact, integrated solutions, such as personal communications services (PCS) devices.

One alternative to a static digital-to-analog converter is a so-called "digital-based" digital-to-analog converter. In general, digital-based digital-to-analog converters require relatively less power and space than their static digital-to-analog counterparts, making digital based converters particularly well suited for small, integrated applications. Two approaches used in digital-based digital-to-analog converters are pulse width modulation (PWM) and pulse density modulation (PDM).

As is well known in the art, PWM involves processing an N-bit input value to generate an analog signal with a voltage level that is proportional to the N-bit input value. A typical PWM modulator includes an N-bit counter, an N-bit comparator and a filter. The N-bit input value is applied to one of the comparator inputs. The output of the counter is applied to the other comparator input. The comparator compares the magnitude of the N-bit input value to the magnitude of the continuously counting counter output to generate a single bit periodic digital signal.

Characteristically, the duty cycle of the single bit periodic digital signal is proportional to the N-bit input value. Consider a three bit example, where the N-bit input value is three bits, the counter is a three bit counter and the comparator is a three bit comparator. For a single modulation cycle, the counter will count from "000" to "111". For a three bit input value of "001", the output of the three bit comparator is "11000000", which is continuously repeated. An output of "1" represents a logic HIGH and a "0" represents a logic LOW. For an input value of "110", the output of the three bit comparator is "11111110". Thus, the pulse width for the input value of "001" is two bits, while the pulse width for the input value of "110" is seven bits. The comparator output is applied to the filter to average the discrete levels of the single bit digital signal to produce a constant analog signal. The duty cycle of the single bit digital signal determines the value of the resulting analog signal.

A characteristic of PWM that presents some practical difficulties is that all of the logic HIGHs and LOWs ("1"s and "0"s) are contiguous within a modulation cycle. This characteristic is represented in the analog output as an AC component, which is often referred to as "ripple", typically expressed as a percentage of the logic HIGH voltage level. Ideally, the analog output is a constant DC value. However, because of the contiguous nature of the logic HIGHs and LOWs in the analog output, the analog output of a PWM modulator often contains AC ripple. The cutoff frequency of the filter is often lowered to attenuate ripple. However, this requires increasing the time constant of the filter which can significantly increase the response time of the filter and in some cases cause instability in control loops, making it unsuitable for high speed applications.

PDM is similar to PWM except that the ripple in the analog output is characteristically lower than in a comparable PWM analog signal. The reduced ripple is attributable to the logic HIGHs being more evenly distributed within a counter cycle. For example, for a modulation cycle having three logic HIGHs and five logic LOWs, the logic HIGHs are typically spaced apart by the logic LOWs. One common approach for distributing the logic HIGHs more evenly involves providing the output of the counter in non-sequential bit order to the comparator, typically by connecting the most significant through least significant outputs of the counter to the least significant through most significant inputs, respectively, of the comparator.

Refer again to the previous example where, for a single cycle, the counter counts from "000" to "111". However, the non-sequential inputs to the comparator are: "000", "100", "010", "110", "001", "101", "011"and "111". For a three bit input value of "001", the output of the three bit comparator is "10001000", which is continuously repeated. For an input value of "100",the output of the three bit comparator is "11101010". Thus, the logic HIGHs are more evenly distributed across a single cycle which, when processed by a filter, provide an analog output with a reduced AC component.

Although the PDM approach provides improved performance over the PWM approach, it has disadvantages. One of the problems with the PDM approach is that as the size of the input words increases, the time constant of the filter must be increased, causing a slower filter response. This problem can be particularly acute in applications that require large input words but also small integrated solutions, such as cellular telephony.

Accordingly, based upon the need to convert digital input values to analog signals in circuits and the limitations in prior approaches, an approach for performing digital-to-analog conversion that supports relatively large input words while providing relatively low ripple is highly desirable.

SUMMARY OF THE INVENTION

This and other needs are met by embodiments of the invention, which in one aspect provide a digital-to-analog converter comprising: a pulse density modulator responsive to a first portion of a digital input value to provide a pulse density modulated signal, a filter coupled to the pulse density modulator and responsive to the pulse density modulated signal to provide a first analog signal, a static digital-to-analog converter responsive to a second portion of the digital input value to provide a second analog signal and an adder coupled to both the filter and the static digital-to-analog converter and responsive to the sum of both the first and second analog signals to provide an analog output signal corresponding to both the first and second portions of the digital input value.

The earlier stated needs are also met by another aspect of the invention, which provides a digital-to-analog converter arrangement comprising: first combinational logic responsive to a first portion of a digital input value to provide a pulse density modulated signal, a filter coupled to the first combinational logic and responsive to the pulse density modulated signal to provide a first analog signal, second combinational logic responsive to a second portion of the digital input value to provide a second analog signal and an adder coupled to both the filter and the second combinational logic and responsive to both the first and second analog signals to provide an analog output signal corresponding to the both the first and second portions of the digital input value.

The earlier stated needs are further met by another aspect of the invention, which provides a digital-to-analog converter comprising: a pulse density modulator responsive to a first portion of a digital input value to provide a pulse density modulated signal, a static digital-to-analog converter responsive to both a second portion of the digital input value and the pulse density modulated signal to provide an analog output signal and a filter coupled to the static digital-to-analog converter and responsive to the analog output signal to provide a filtered analog output signal.

The earlier stated needs are still further met by another aspect of the invention, which provides a method for converting a digital input value into an analog output signal, the method comprising the steps of: converting a first portion of the digital input value into a pulse density modulated signal, processing the pulse density modulated signal with a filter to generate a first analog signal, converting a second portion of the digital bit input value into a second analog signal and combining the first and second analog signals to generate the analog output signal.

As described in more detail hereinafter, embodiments of the invention described herein provide several advantages over prior approaches for converting a digital signal to an analog signal. In general, the approach described herein provides the benefits of both the static digital-to-analog conversion and pulse density modulated approaches with fewer of the disadvantages inherent in these approaches. Specifically, the approach provides the favorable performance characteristics of a pulse density modulated approach while allowing the number of bits to be increased using a small static digital-to-analog converter without changing the characteristics of the filter associated with the pulse density modulator. Since the static digital-to-analog converter handles a relatively small number of the most significant bits, its size has less of an impact on integrated solutions. Thus, the number of bits handled by the static digital-to-analog converter and the pulse density modulator can be "tuned" to the requirements of a particular application.

Other aspects and advantages of the invention will become apparent from the following description and claims.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

The present invention is directed to an approach for converting an M-bit digital input value to an analog output signal. In general, the (M−N) number of most significant bits of the M-bit digital value are processed separately from the N number of least significant bits of the M-bit digital input value. The N number of least significant bits are processed by a pulse density modulator and a filter to provide a first analog signal. The (M−N) number of most significant bits are processed by a static digital-to-analog converter to provide a second analog signal. The first and second analog signals are combined to provide the analog output signal. Using both a static digital-to-analog converter and a pulse density modulator eases the cut-off frequency requirements of the filter used to process the output of the pulse density modulator and allows the number of bits in the M-bit input value to be increased with minimal impact on the design.

Figure 1:
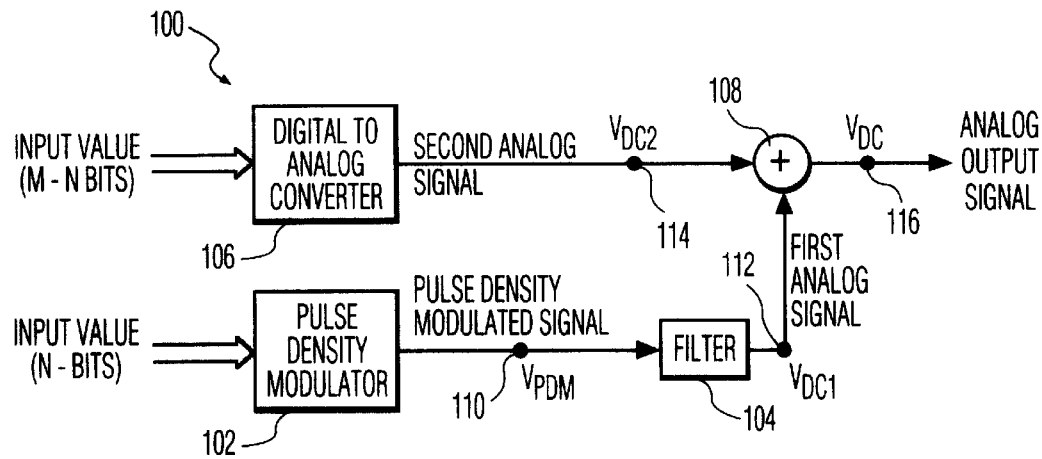
FIG. 1 is a block diagram illustrating a digital-to-analog conversion arrangement according to an embodiment of the invention.

FIG. 1 is a block diagram illustrating a digital-to-analog converter arrangement 100 according to an embodiment of the invention. Arrangement 100 includes a pulse density modulator 102, a filter 104, a digital-to-analog converter 106 and a summer 108. An N-bit digital input value, representing the N number of least significant bits of an M-bit digital input value, is provided to pulse density modulator 102 that generates a pulse density modulated signal reflecting the N-bit input value. As is characteristic of pulse density modulators, the duty cycle of the pulse density modulated signal generated by pulse density modulator 102 is related to the N-bit input value. As is further characteristic of pulse density modulators, logic HIGHs contained in the modulated signal generated by pulse density modulator 102 are distributed generally evenly across a modulation cycle.

Figure 2:
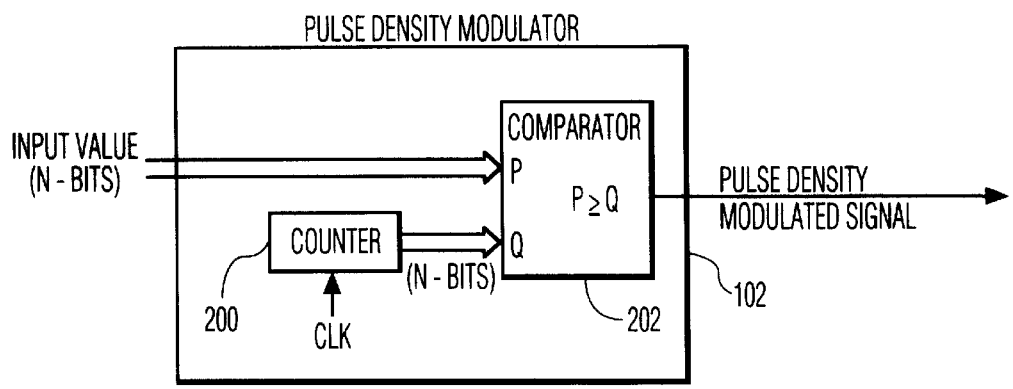
FIG. 2 is a block diagram illustrating a pulse density modulator used in the digital-to-analog conversion arrangement of FIG. 1 according to an embodiment of the invention.

Pulse density modulator 102 may be implemented with conventional combinational logic, one or more integrated devices, discrete hardware circuitry, or any combination thereof. The invention is not limited to a particular implementation of pulse density modulator 102. According to one embodiment of the invention as illustrated in FIG. 2, pulse density modulator 102 is implemented using a counter 200 and a comparator 202. Pulse density modulator 102 as illustrated in FIG. 2 may also include other logic not illustrated, for example reset logic associated with counter 200, but is illustrated and described in the context of counter 200 and comparator 202 for purposes of explanation.

Counter 200 receives an input clock signal (CLK) and provides an N-bit incremental count signal to comparator 202 as the "Q" input. The "P" input of comparator 202 is the N-bit input value. Preferably, the N-bit incremental count signal is provided to comparator 202 in non-sequential bit order so that comparator 202 does not receive the count signals in numerical order. This is typically accomplished by connecting the most-significant through the least-significant outputs of the N-bit incremental count signal of counter 200 to the least significant through most significant inputs, respectively, of the "Q" input of comparator 202. This arrangement is sometimes referred to as a "non-sequential coupling" of counter 200 and comparator 202. However, the outputs of counter 200 may be connected to the inputs of comparator 202 in other ways.

The pulse density modulated signal generated by comparator 202 is a single bit digital output signal representative of the magnitude comparison of the N-bit input value and the N-bit incremental count signal generated by counter 200. As illustrated in FIG. 2, comparator 202 applies a greater than or equal to function to the values presented on the "P" and "Q" inputs and generates a logic HIGH when the value presented on the "P" input is greater than or equal to the value presented on the "Q" input. Although embodiments of the invention are described herein in the context of comparator 202 performing a "greater than or equal to" function, other functions may be used. Examples of other functions include greater than, less than or equal to and less than. As is well understood in the context of pulse density modulation, the ratio of the total time during one period that the pulse density modulated signal is a logic HIGH is based upon the value of the N-bit input value.

Referring again to FIG. 1, filter 104 receives and processes the pulse density modulated signal provided by pulse density modulator 102 and generates a first analog signal with an average magnitude that is representative of the pulse density modulated signal. An ideal filter 104 provides the first analog signal with no AC component and can react instantaneously to discrete changes in the pulse density modulated signal. However, most filter designs require a trade-off between the amount of AC component present in the analog signal and the reaction time of the filter to changes in the pulse density modulated input signal. More specifically, when filter 104 is implemented as a low-pass filter, reducing the cut-off frequency generally reduces the amount of undesired AC component in the first analog signal. However, reducing the cut-off frequency causes filter 104 to react more slowly to discrete changes in the pulse density modulated input signal. Conversely, increasing the cut-off frequency of filter 104 causes filter 104 to more quickly react to changes in the pulse density modulated input signal but increases the amount of AC component present in the first analog signal.

Figure 3:
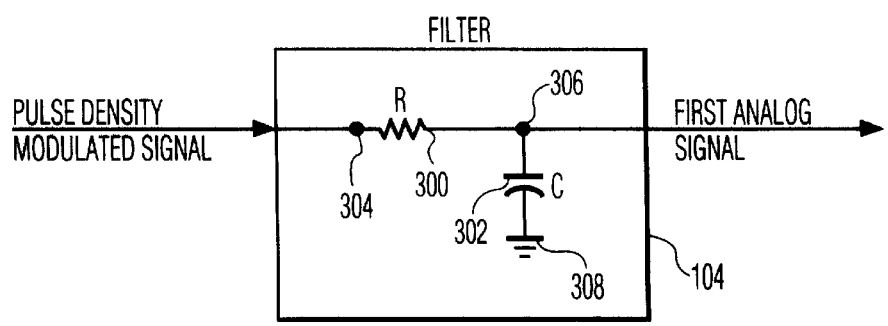
FIG. 3 is a block diagram schematically illustrating a circuit implementation of a filter used in the digital-to-analog conversion arrangement of FIG. 1 according to an embodiment of the invention.

FIG. 3 illustrates a circuit schematic of filter 104 according to an embodiment of the invention. In this embodiment, filter 104 is a resistor-capacitor filter or "RC" filter that includes a resistor "R" 300 and a capacitor "C" 302. Resistor 300 is connected between a node 304 and a node 306. Node 304 functions as an input to filter 104 and the pulse density modulated signal from pulse density modulator 102 is provided to filter 104 at node 304. Node 306 functions as an output node for filter 104 and the first analog signal generated by filter 104 is presented at node 306. Capacitor 302 is connected between node 306 and a ground 308. Other implementations of filter 104 may be used and the invention is not limited to a particular implementation of filter 104. The values selected for resistor 300 and capacitor 302 depend on the requirements of a specific application and in particular depend upon the AC components to be filtered and the desired response of filter 104 The invention is not limited to a particular type of filter and filter types other than those specifically described herein may be used.

Referring again to FIG. 1, an (M−N)-bit digital input value, representing the (M−N) number of most significant bits of the M-bit digital input value, is provided to digital-to-analog converter 106 that generates a second analog signal representative of the (M−N)-bit digital input value. The second analog signal is provided to summer 108 that combines both the first and second analog signals to generate an analog output signal that is representative of both the (M−N)-bit input value and the N-bit input value. Embodiments of the invention are particularly well suited for applications where the number of bits in the M-bit digital input value is increased because the added bits can be processed by digital-to-analog converter 106 without changing the time constant of filter 104.

It should be noted that, for purposes of explanation, embodiments of the invention are primarily illustrated and described in the context of the (M−N)-bit input and N-bit input values representing the most significant and least significant portions, respectively, of an M-bit digital input value. However, the invention is applicable to applications where the (M−N)-bit input value and N-bit input value do not represent portions of a single digital input value. For example, embodiments of the invention may be used in applications where the (M−N)-bit input value and N-bit input value are derived from separate portions of a circuit.

Figure 4A:
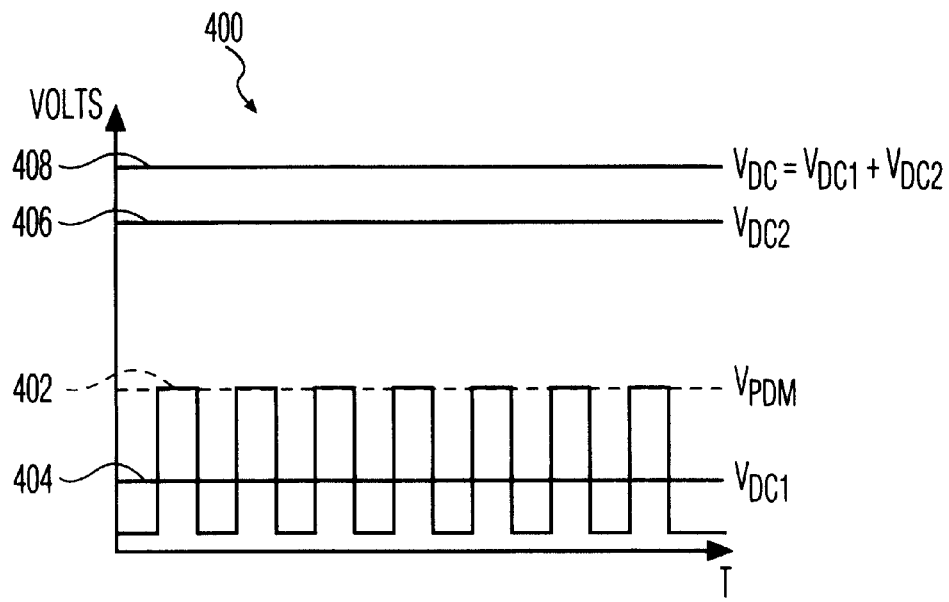
FIGS. 4A and 4B are charts illustrating the operation of the digital-to-analog conversion arrangement of FIG. 1 according to an embodiment of the invention.

FIG. 4A is a graph 400 illustrating the operation of digital-to-analog converter arrangement 100 where the (M−N)-bit input value represents the (M−N) number of most significant bits of an M-bit digital input word and the N-bit input value represents the N number of least significant bits of the M-bit digital input word. Square wave 402 represents the pulse density modulated signal at node 110 generated by pulse density modulator 102 and having a voltage level of $V_{PDM}$. Line 404 represents the first analog signal at node 112 generated by filter 104 and having a voltage level of $V_{DC1}$. As previously discussed, the first analog signal generated by filter 104 characteristically includes a small amount of ripple, not illustrated on line 404, generally on the order of about ten (10) to twenty (20) percent of voltage ($V_{PDM}/2^N$). Line 406 represents the second analog signal at node 114 generated by digital-to-analog converter 106 and having a voltage level of $V_{DC2}$. Line 408 represents the analog output value at node 116 generated by summer 108 and having a voltage level of $V_{DC}$, where $V_{DC}$ is equal to the sum of $V_{DC1}$ and $V_{DC2}$.

Figure 4B:
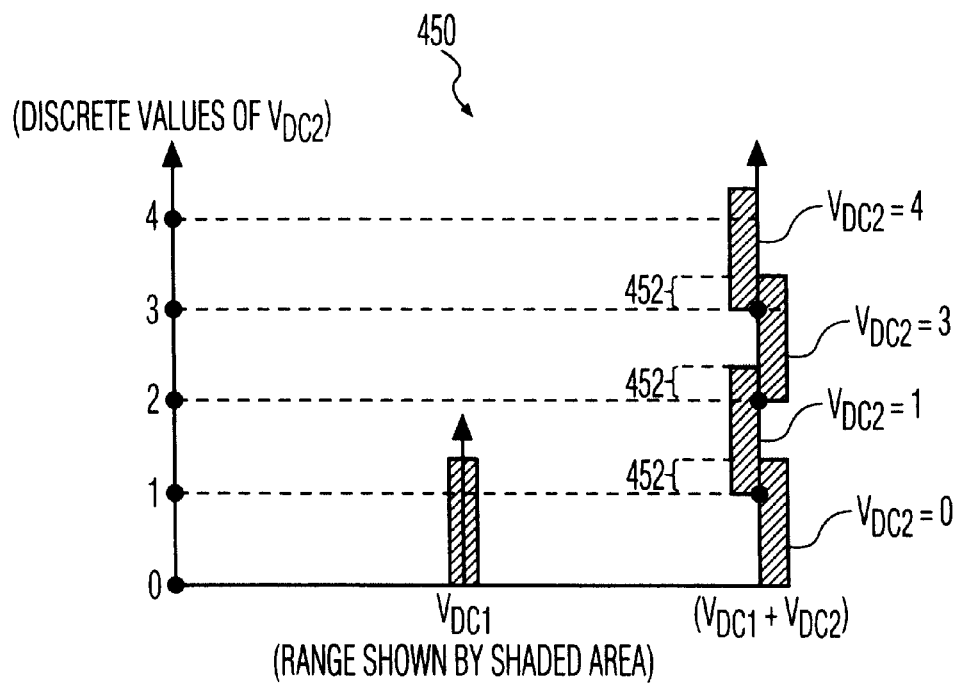

Furthermore, the maximum voltage level ($V_{DC1}$) of the first analog signal 404 is ideally at least slightly greater than the portion of voltage level ($V_{DC2}$) of the second analog signal 406 that is attributable to the voltage level (weight) of the least significant bit of the (M−N)-bit input value. As illustrated by the graph 450 of FIG. 4B, this approach ensures "overlap" as indicated by reference numeral 452, between the voltage range for adjacent levels of $V_{DC2}$. This allows digital-to-analog converter 106 to perform the coarse digital-to-analog conversion and pulse density modulator 102 to perform the fine digital-to-analog conversion.

Although described and illustrated in the context of specific embodiments, digital to analog converter 108 and pulse density modulator 102 may be implemented using combinational logic, discrete hardware circuitry, or any combination thereof. For example, pulse density modulator 102 and digital to analog converter 108 may be implemented using first and second combinational logic, respectively.

The approach described herein for converting a digital signal to an analog signal provides the benefits of both the static digital-to-analog conversion and pulse density modulated approaches with fewer of the disadvantages inherent with these approaches. Specifically, the approach provides the favorable performance characteristics of a pulse density modulated approach while allowing the number of bits to be increased using a small static digital-to-analog converter without changing the characteristics of the filter associated with the pulse density modulator. Since the static digital-to-analog converter handles a relatively small number of the most significant bits, its size has less of an impact on integrated solutions. Thus, the number of bits handled by the static digital-to-analog converter and the pulse density modulator can be "tuned" to the requirements of a particular application.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A digital-to-analog converter arrangement comprising:
    a digital-to-analog converter of a first type, including a pulse density modulator and a filter coupled to the pulse density modulator, the first digital-to-analog converter being responsive to a first portion of a digital input value to provide a pulse density modulated signal to the filter and the filter being responsive to the pulse density modulated signal to provide a first analog signal;
    a second digital-to-analog converter of a second type including a static digital-to-analog converter, the second digital-to-analog converter being responsive to a second portion of the digital input value to provide a second analog signal; and
    a combiner coupled to both the first and the second digital-to-analog converters and responsive to both the first and second analog signals to provide an analog output signal corresponding to both the first and second portions of the digital input value.

2. The digital-to-analog converter arrangement as recited in claim 1, wherein the pulse density modulator comprises a counter and a comparator, the counter being responsive to a clock signal to provide a sequential count signal to the comparator, the comparator being configured to compare the first portion of the digital input value to the sequential count signal to provide the pulse density modulated signal.

3. The digital-to-analog converter arrangement as recited in claim 2, wherein the sequential signal is provided to the comparator in non-sequential bit order.

4. The digital-to-analog converter arrangement as recited in claim 1, wherein the filter is an RC filter.

5. The digital-to-analog converter arrangement as recited on claim 1, wherein the digital input value is an M-bit digital input value and wherein the first portion of the digital input value represents N number of least significant bits of the M-bit digital input value and the second portion of the digital input value represents (M–N) number of most significant bits of the M-bit digital input value and wherein M is greater than N.

6. A digital-to-analog converter arrangement comprising:
    first combinational logic responsive to a first portion of a digital input value to provide a pulse density modulated signal;
    a filter coupled to the first combinational logic, including a static digital-to-analog converter, responsive to the pulse density modulated signal to provide a first analog signal;
    second combinational logic, including a static digital-to-analog converter, responsive to a second portion of the digital input value to provide a second analog signal; and
    an adder circuit coupled to both the filter and the second combinational logic and responsive to both the first and second analog signals, the adder circuit being adapted to provide an analog signal corresponding to the sum of both the first and second portions of the digital input value.

7. A method for converting a digital input value into an analog output signal, the method comprising the steps of:
    converting a first portion of the digital input value into a pulse density modulated signal;
    processing the pulse density modulated signal with a filter to generate a first analog signal;
    using a static digital-to-analog converter to convert a second portion of the digital input value into a second analog signal; and
    using an adder circuit to combine the first and second analog signals to generate the analog out put signal.

8. The method as recited in claim 7, wherein the step of converting a first portion of the digital input value into a pulse density modulated signal includes generating a sequential count signal, and comparing the sequential count signal to the first portion of the digital input value.

9. The method as recited in claim 8, wherein the sequential count signal is in non-sequential bit order.

10. The method as recited in claim 7, wherein the digital input value is an M-bit digital input value and wherein the first portion of the digital input value represents N number of least significant bits of the M-bit digital input value and the second portion of the digital input value represents (M–N) number of most significant bits of the M-bit digital input value and wherein M is greater than N.

11. An arrangement for converting a digital input value into an analog output signal, comprising:
    means for converting a first portion of the digital input value into a pulse density modulated signal;
    means for processing the pulse density modulated signal with a filter to generate a first analog signal;
    means, including a static digital-to-analog converter, for converting a second portion of the digital input value into a second analog signal; and
    means, including an adder circuit, for combining the first and second analog signals to generate the analog out put signal.

* * * * *